US012672354B2

(12) United States Patent
Wang

(10) Patent No.: US 12,672,354 B2
(45) Date of Patent: Jun. 30, 2026

(54) SEMICONDUCTOR DEVICE AND METHOD FOR FORMING THE SAME

(71) Applicant: Vanguard International Semiconductor Corporation, Hsinchu (TW)

(72) Inventor: Cheng-Yu Wang, Chiayi City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 513 days.

(21) Appl. No.: 18/187,807

(22) Filed: Mar. 22, 2023

(65) Prior Publication Data

US 2024/0321858 A1     Sep. 26, 2024

(51) Int. Cl.
H10D 86/85          (2025.01)
H10D 86/01          (2025.01)
H10W 20/43          (2026.01)

(52) U.S. Cl.
CPC ............. H10D 86/85 (2025.01); H10D 86/01 (2025.01); H10W 20/43 (2026.01)

(58) Field of Classification Search
CPC .......... H10D 86/85; H10D 86/01; H10D 1/47; H01L 23/528
See application file for complete search history.

(56) References Cited

U.S. PATENT DOCUMENTS 6,770,918 B2 *   8/2004   Russ .................... H10D 18/251
                                                    257/361

9,159,791 B2 *   10/2015   Chen .................. H10D 30/0293
9,502,584 B1 *   11/2016   Chang .................... H10D 8/045
(Continued)

FOREIGN PATENT DOCUMENTS

CN        108336082 A   *   7/2018   .......... H10D 89/713
CN        110544690 A       12/2019
(Continued)

OTHER PUBLICATIONS

Taiwanese Office Action and Search Report for Taiwanese Application No. 111144748, dated Mar. 13, 2024.
(Continued)

*Primary Examiner* — Laura M Menz
(74) *Attorney, Agent, or Firm* — Birch, Stewart, Kolasch & Birch, LLP

(57) ABSTRACT

A semiconductor device includes a semiconductor layer, a deep trench isolation structure, a shallow trench isolation structure, a first resistance layer, a second resistance layer, a first heavily doped region, a second heavily doped region, and a conductive line. The deep trench isolation structure separates the semiconductor device into a plurality of units including the first and second units. The shallow trench isolation structure is disposed on a portion of the semiconductor layer in one of the plurality of units. The first and second resistance layers are disposed on the shallow trench isolation structure in the first and second units respectively. The first and second heavily doped regions are embedded in the shallow trench isolation structure and in physical contact with the semiconductor layer in the first and second units respectively. The conductive line electrically connects the first and second resistance layers and the second heavily doped region.

17 Claims, 4 Drawing Sheets

<u>10</u>

10A          10B          10C 130A          130B          130C 150
120
110
100
102
104

140A          140B          140C

(56)                    References Cited

U.S. PATENT DOCUMENTS

| | | | | |
|---|---|---|---|---|
| 9,548,375 | B1 * | 1/2017 | Chang | H10D 8/045 |
| 9,589,971 | B1 * | 3/2017 | Chang | G11C 17/16 |
| 10,396,196 | B1 * | 8/2019 | Chang | H10D 30/657 |
| 12,317,557 | B1 * | 5/2025 | Hwang | H10D 62/124 |
| 2003/0047750 | A1 * | 3/2003 | Russ | H10D 18/251 |
| | | | | 257/E29.085 |
| 2005/0145953 | A1 * | 7/2005 | Chan | H10D 84/401 |
| | | | | 438/234 |
| 2011/0298446 | A1 | 12/2011 | Shiraki et al. | |
| 2013/0249007 | A1 * | 9/2013 | Chu | H10D 30/65 |
| | | | | 257/E27.06 |
| 2015/0243783 | A1 * | 8/2015 | Lee | H10D 30/0221 |
| | | | | 438/286 |
| 2022/0013542 | A1 * | 1/2022 | Wu | H10D 86/201 |
| 2022/0069123 | A1 * | 3/2022 | Chiu | H10D 62/116 |
| 2023/0207682 | A1 * | 6/2023 | Imam | H10D 30/0297 |
| | | | | 257/330 |
| 2023/0223296 | A1 * | 7/2023 | Fukuda | H10W 10/0121 |
| | | | | 257/510 |
| 2023/0369391 | A1 * | 11/2023 | Pang | H10D 62/107 |
| 2024/0321858 | A1 * | 9/2024 | Wang | H10D 86/85 |

FOREIGN PATENT DOCUMENTS

| | | | | | |
|---|---|---|---|---|---|
| CN | 111146286 | A | * | 5/2020 | H10D 30/0285 |
| CN | 111584366 | A | * | 8/2020 | H10D 30/65 |
| CN | 113571520 | A | * | 10/2021 | H10D 64/257 |
| CN | 111146286 | B | * | 3/2023 | H10D 30/0285 |
| CN | 118116902 | A | * | 5/2024 | H10W 10/17 |
| EP | 1294025 | A2 | * | 3/2003 | H10D 8/00 |
| JP | 2001023253 | A | * | 1/2001 | B29C 43/021 |
| JP | 2003179150 | A | * | 6/2003 | H01L 27/0262 |
| TW | 201714315 | A | | 4/2017 | |
| TW | 202017175 | A | * | 5/2020 | |
| TW | 1713218 | B | * | 12/2020 | |

OTHER PUBLICATIONS

Taiwanese Office Action and Search Report for Taiwanese Application No. 111144748, dated Aug. 22, 2023.

* cited by examiner 100
102
104

106A     106B 120
100
102
104

SEMICONDUCTOR DEVICE AND METHOD FOR FORMING THE SAME

BACKGROUND

Technical Field

The present disclosure relates to semiconductor device, and in particular it relates to a semiconductor device including a deep trench isolation (DTI) structure.

Description of the Related Art

Semiconductor devices include a substrate and circuit components disposed on the substrate, and have been widely used in various electronic products, such as personal computers, mobile phones, digital cameras, and other electronic equipment. The evolution of semiconductor devices continues to influence and improve the way of life of human beings.

Semiconductor devices generally include isolation structures to electrically isolate different regions of the semiconductor layer. Isolation structures may be formed by etching trenches in a semiconductor device and forming insulating material in the trenches. Depending on the depth of the trench, the isolation structure may be classified into a shallow trench isolation (STI) structure and a deep trench isolation structure. Shallow trench isolation structures with a shallower depth are often used to reduce parasitic capacitance and provide a lower level of voltage isolation between devices. Deep trench isolation structures, on the other hand, have a greater depth to provide isolation between integrated circuits that share different portions of the same semiconductor layer.

However, although these isolation structures generally meet the requirements, they are still not satisfactory in every aspect, and may limit the performance of semiconductor devices in some cases. For example, in the case that a plurality of parts of the semiconductor layer are surrounded by a plurality of tanks formed by deep trench isolation structures, if the resistive layer connecting the conductive lines is disposed on the shallow trench isolation structures on the semiconductor layer, the operating voltage is limited by the thickness of the shallow trench isolation structure. In applications where the thickness of the shallow trench isolation structure must be reduced, it may cause breakdown between the resistive layer and the semiconductor layer and generate leakage current due to an excessively high operating voltage. Therefore, it is necessary to further improve the configuration of semiconductor devices, so that semiconductor devices can be used more widely.

BRIEF SUMMARY

The present disclosure provides a semiconductor device. The semiconductor device includes a semiconductor layer, a deep trench isolation structure, a shallow trench isolation structure, a first resistance layer, a second resistance layer, a first heavily doped region, a second heavily doped region, and a conductive line. The deep trench isolation structure separates the semiconductor device into a plurality of units, which include a first unit and a second unit. The shallow trench isolation structure is disposed on a portion of the semiconductor layer in one of the plurality of units. The first resistance layer and the second resistance layer are disposed on the shallow trench isolation structure in the first unit and the second unit respectively. The first heavily doped region and the second heavily doped region are embedded in the shallow trench isolation structure and in physical contact with the semiconductor layer in the first unit and the second unit respectively. The conductive line electrically connects the first resistance layer, the second resistance layer, and the second heavily doped region.

The present disclosure provides a method for forming a semiconductor device. The method includes forming a shallow trench isolation structure on a semiconductor layer. The method further includes forming a first resistance layer and a second resistance layer on the shallow trench isolation structure. The method further includes embedding a first heavily doped region and a second heavily doped region into the shallow trench isolation structure. The first heavily doped region and the second heavily doped region are in physical contact with the semiconductor layer. The method further includes forming a deep trench isolation structure separating the semiconductor device into a plurality of units comprising a first unit and a second unit. The first resistance layer and the first heavily doped region are in the first unit, and the second resistance layer and the second heavily doped region are in the second unit. The method further includes forming a conductive line electrically connecting the first resistance layer, the second resistance layer, and the second heavily doped region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion

DETAILED DESCRIPTION

Figure 1:
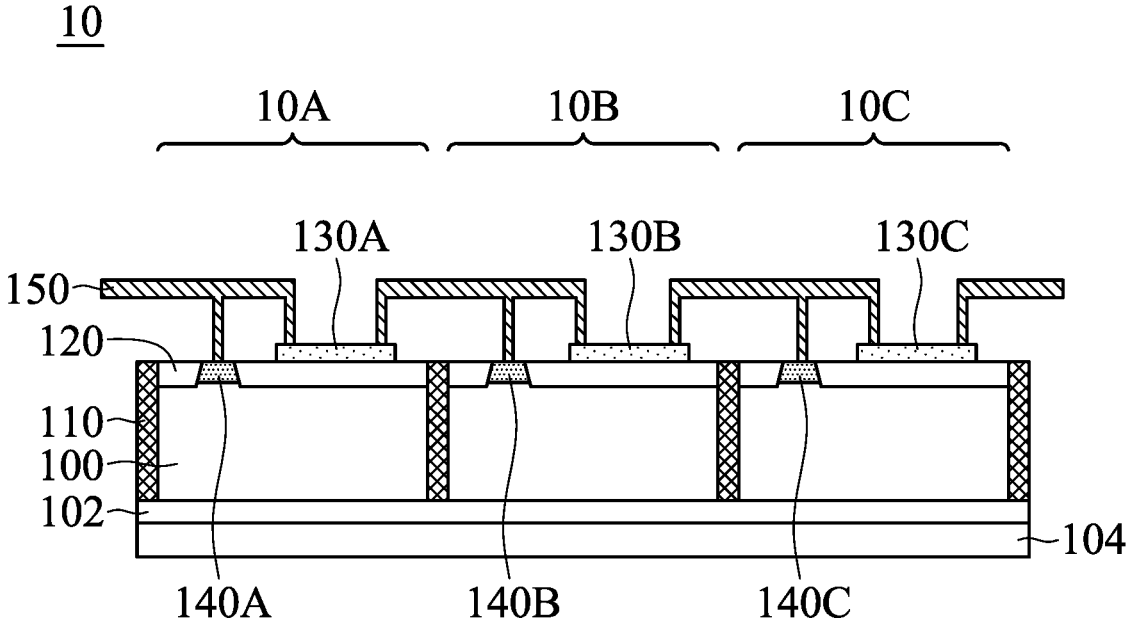
FIG. 1 illustrates a cross-sectional view of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "substantially" used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even "about", "approximate", or "substantially" are not specified, the meanings of "about", "approximate", or "substantially" are still implied.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The term "substantially" is used herein to indicate that the value of a given quantity may vary based on the particular technology node associated with the target semiconductor device. In some embodiments, the term "substantially" may mean that a value of a given quantity is, for example, within a range of ±5% of a target (or expected) value based on a specific technology node.

The present disclosure provides a semiconductor device including a deep trench isolation structure and a heavily doped region. The multiple heavily doped regions embedded in the shallow trench isolation structure can prevent current breakdown from occurring between the resistance layer and the semiconductor layer. In this way, by using the deep trench isolation structure to separate the semiconductor layer of each tank, and electrically connecting each unit with a lower limiting voltage with a conductive line, the voltage can be reduced multiple times between each unit (tank). Compared with the conventional structure with a resistive layer for voltage drop, the semiconductor device of the present disclosure can be applied with a higher operating voltage without increasing the thickness of the shallow trench isolation structure on the semiconductor layer.

FIG. 1 is a cross-sectional view of a semiconductor device 10 according to some embodiments of the present disclosure. The semiconductor device 10 includes a semiconductor layer 100 and a deep trench isolation structure 110 separating the semiconductor device into a plurality of units, which include a first unit 10A and a second unit 10B. The semiconductor device 10 further includes a shallow trench isolation structure 120 disposed on a portion of the semiconductor layer 100 in one of the plurality of units. As shown in FIG. 1, there are a first resistance layer 130A and a second resistance layer 130B disposed on the shallow trench isolation structure 120 in the first unit 10A and the second unit 10B respectively. In addition, there are a first heavily doped region 140A and a second heavily doped region 140B embedded in the shallow trench isolation structure 120 and physically contacting the semiconductor layer 100 in the first unit 10A and the second unit 10B respectively. The semiconductor device 10 further includes a conductive line 150 electrically connecting the first resistance layer 130A, the second resistance layer 130B, and the second heavily doped region 140B.

In some embodiments, as shown in FIG. 1, the deep trench isolation structure 110 penetrates through the shallow trench isolation structure 120 between each unit. The deep trench isolation structure 110 may laterally surround portions of the semiconductor layer 100 in each unit, and the semiconductor layer 100 is electrically isolated between each unit. In some embodiments, the shallow trench isolation structure 120 is discontinuous between each unit. For example, the portions of the shallow trench isolation structure 120 in each unit may be separated by the deep trench isolation structure 110.

It should be understood that the term "unit" described in this disclosure includes the portion of the semiconductor layer 100 surrounded by the tank formed by the deep trench isolation structure 110 and other layers and regions substantially formed above this portion of the semiconductor layer 100 directly. For example, the first resistive layer 130A and the first heavily doped region 140A of the first unit 10A, and lower portions of the semiconductor layer 100 and the shallow trench isolation structure 120 of the first unit 10A, which are surrounded by the deep trench isolation structure 110, are located in the same tank.

The material of the deep trench isolation structure 110 and the shallow trench isolation structure 120 includes oxide, nitride, low dielectric constant (low-k) dielectric material with a dielectric constant less than about 3.9, extreme low-k (ELK) dielectric material with a dielectric constant less than about 2, or a combination thereof. In some embodiments, the deep trench isolation structure 110 and the shallow trench isolation structure 120 comprise different materials.

Specifically, the material of the deep trench isolation structure 110 and the shallow trench isolation structure 120 may be, for example, silicon oxide, silicon oxynitride, phosphosilicate glass (PSG), borosilicate glass (BSG), borophosphosilicate glass (BPSG), undoped silicate glass (USG), fluorinated silicate glass (FSG), other suitable materials, or a combination thereof.

The semiconductor layer 100 may be doped (for example, doped with p-type or n-type dopants) or undoped. The material of the semiconductor layer 100 may include: silicon; germanium; compound semiconductors, including silicon carbide, gallium arsenide, gallium phosphide, indium phosphide, indium arsenide, and/or indium antimonide; alloy semiconductors, including silicon germanium, gallium arsenide phosphide, aluminum indium arsenide, aluminum gallium arsenide, gallium indium arsenide, gallium indium phosphide and/or gallium indium arsenide phosphide; or a combination thereof.

In some embodiments, the semiconductor device 10 has a semiconductor-on-insulator (SOI) substrate. For example, as shown in FIG. 1, the semiconductor device 10 may further include an insulating layer 102 covering the bottom surface of the semiconductor layer 100. The insulating layer 102 may include a buried dielectric layer, such as buried oxide (BOX), buried nitride, similar materials, or a combination thereof. By disposing the insulating layer 102, leakage current can be prevented from being generated on the bottom surface of the semiconductor layer 100. In some embodiments, the deep trench isolation structure 110 extends from the top surface of the shallow trench isolation structure 120 to the top surface of the insulating layer 102 to completely isolate portions of the semiconductor layer 100 between the units.

In some embodiments, the semiconductor device 10 further includes a carrier substrate 104 below the semiconductor layer 100. For example, the carrier substrate 104 may include a silicon substrate, a germanium substrate, a silicon germanium substrate, a silicon carbide substrate, an aluminum nitride substrate, a gallium nitride substrate, similar materials, or a combination thereof.

In some embodiments, the first resistance layer 130A and the second resistance 130B are horizontally spaced apart from the edges of the first unit 10A and the second unit 10B, respectively. In this disclosure, the thicknesses of the first resistance layer 130A and the second resistance layer 130B are not limited, as long as the first resistance layer 130A and the second resistance layer 130B can be used as resistors. The first resistance layer 130A and the second resistance layer 130B may include materials suitable for use as resistors.

The first heavily doped region 140A and the second heavily doped region 140B may be doped with p-type or n-type dopants. For example, the p-type dopant may be boron, aluminum, gallium, $BF_2$, similar materials or combinations thereof, and the n-type dopant may be nitrogen, phosphorus, arsenic, antimony, similar materials or combinations thereof. In some embodiments, the first heavily doped region 140A, the second heavily doped region 140B, and the semiconductor layer 100 have the same conductivity type. In some embodiments, the thickness of the first heavily doped region 140A and the second heavily doped region 140B is smaller than the thickness of the shallow trench isolation structure 120. For example, the thickness of the first heavily doped region 140A and the second heavily doped region 140B may be about 0.5 µm. In some embodiments, as shown in FIG. 1, the area of top surfaces of the first heavily doped region 140A and the second heavily doped region 140B is smaller than the area of bottom surfaces. By forming the first heavily doped region 140A and the second heavily doped region 140B, the ohmic contact with the subsequently formed conductive line 150 can be established, which is beneficial to provide the voltage in the tank.

When an operating voltage is applied to the semiconductor device 10 through the conductive lines 150, the first heavily doped region 140A and the second heavily doped region 140B can form an ohmic contact at the interface with the semiconductor layer 100. In this way, current breakdown between the first resistance layer 130A and the second resistance layer 130B and the semiconductor layer 100 can be avoided.

In some embodiments, as shown in FIG. 1, the plurality of units further include a third unit 10C. The third unit 10C may include a third resistance layer 130C disposed on the STI structure 120 and a third heavily doped region 140C embedded in the STI structure 120 in physical contact with the semiconductor layer 100. The semiconductor device 10 further includes another conductive line 150 electrically connecting the second resistance layer 130B, the third resistance layer 130C, and the third heavily doped region 140C. Each component in the third unit 10C may be formed of the same or similar material as each corresponding component in the first unit 10A and the second unit 10B, and description thereof is omitted here for simplicity.

Although only three units in the semiconductor device 10 are shown in FIG. 1, the present disclosure is not limited thereto. Depending on the operating voltage of the semiconductor device 10, other numbers of units separated by the deep trench isolation structure 110 may be connected in series in the semiconductor device 10 by the conductive lines 150, so as to achieve the effect of decreasing the potential sequentially.

For example, the semiconductor device 10 may further include another conductive circuit 150 electrically connecting the first resistive layer 130A and the first heavily doped region 140A, and this conductive circuit 150 may be electrically connected to a resistive layer in another unit (tank). On the other side, the semiconductor device 10 may further include yet another conductive line 150 electrically connecting the third resistive layer 130C and the resistive layer and a heavily doped region in another unit (tank).

By forming the above-mentioned structure of the present disclosure, a higher operating voltage can be applied to the entire semiconductor device 10 without additionally increasing the thickness of the shallow trench isolation structure 120 on the semiconductor layer 100 to achieve the purpose of increasing the operating voltage.

FIGS. 2A-2F are cross-sectional views illustrating various stages of forming the semiconductor device 10 according to some embodiments of the present disclosure. Although only two units (tanks) of the resulted semiconductor device 10 are shown in FIGS. 2A-2F, the method of forming the semiconductor device 10 discussed below can be used to form a semiconductor device 10 with any number of units (tanks).

Figure 2A:
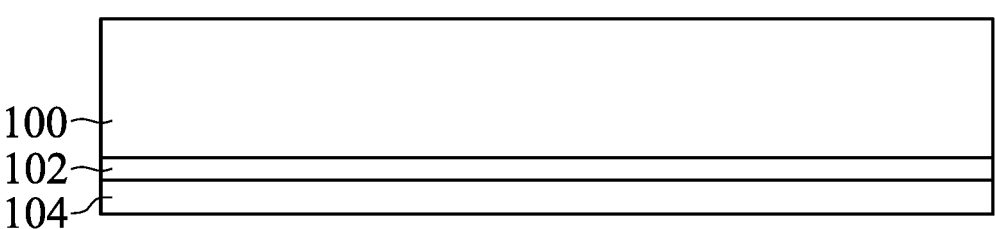
FIGS. 2A-2F illustrate cross-sectional views of various stages of forming a semiconductor device according to some embodiments of the present disclosure.

Referring to FIG. 2A, firstly, a semiconductor layer 100 is provided. In some embodiments, the provided semiconductor layer 100 further includes an insulating layer 102 covering the bottom surface of the semiconductor layer 100. A carrier substrate 104 for transferring the semiconductor layer 100 may be further included below the semiconductor layer 100. In some embodiments, the formation of the semiconductor layer 100, the insulating layer 102, and the carrier substrate 104 may be carried out by a wafer bonding process, an epitaxial layer transfer (ELTRAN) process, similar processes, or a combination thereof.

In some embodiments using a wafer bonding process, the insulating layer 102 is directly bonded to the semiconductor layer 100, and then the two are bonded to the carrier substrate 104, and the semiconductor layer 100 may be thinned before being bonded to the carrier substrate 104.

In some embodiments using the epitaxial layer transfer process, the semiconductor layer 100 is epitaxially grown on a seed layer (not shown), and then the semiconductor layer 100 is oxidized to form the insulating layer 102. After bonding the insulating layer 102 to the carrier substrate 104, the seed layer is removed.

In some embodiments, the semiconductor layer 100 may be doped with p-type or n-type dopants. For example, the p-type dopant may be boron, aluminum, gallium, $BF_2$, similar materials or combinations thereof, and the n-type dopant may be nitrogen, phosphorus, arsenic, antimony, similar materials, or combinations thereof. In some embodiments, the semiconductor layer 100 may be doped by in-situ doping during epitaxial growth and/or by implanting p-type or n-type dopants after epitaxial growth.

Figure 2B:
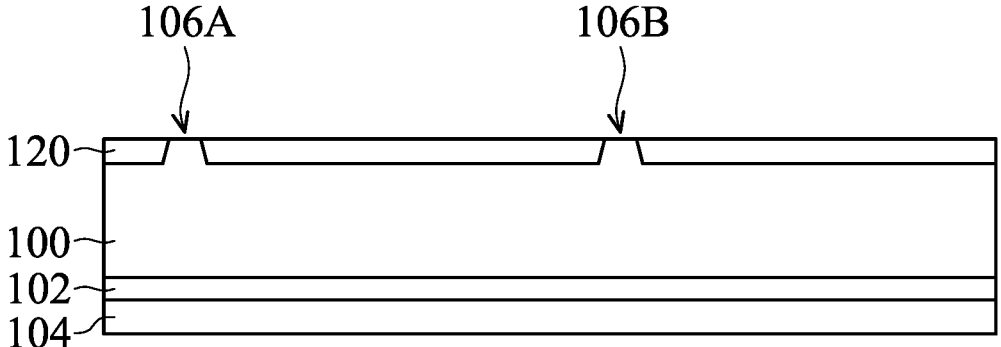

Next, referring to FIG. 2B, a shallow trench isolation structure 120 is formed on the semiconductor layer 100. In some embodiments, the semiconductor layer 100 has a first protruding portion 106A and a second protruding portion 106B in the shallow trench isolation structure 120. These protruding portions may correspond to positions of various heavily doped regions formed subsequently, such as the first heavily doped region 140A and the second heavily doped region 140B. In some embodiments, the first protruding portion 106A and the second protruding portion 106B have a tapered shape.

In some embodiments, the formation of the shallow trench isolation structure 120 may include recessing the semiconductor layer 100 to leave the protruding portions, and then depositing an isolation material on the recessed semiconductor layer 100 to form the shallow trench isolation structure 120 surrounding the protruding portions. The aforementioned recessing process may include, for example, a reactive ion etching (RIE) process, other suitable processes, or a combination thereof.

The aforementioned isolation material for forming the shallow trench isolation structure 120 may be, for example, silicon oxide, silicon oxynitride, phosphosilicate glass (PSG), borosilicate glass (BSG), borophosphosilicate glass (BPSG), undoped silicate glass (USG), fluorinated silicate glass (FSG), other suitable materials, or a combination thereof. In addition, the isolation material may be formed by high density plasma chemical vapor deposition (HDP-CVD), flowable CVD (FCVD), other suitable deposition processes, or a combination thereof.

In some embodiments, a planarization process such as chemical mechanical polish (CMP), an etch back process, or a combination thereof may be used to remove excess isolation material. In this way, the top surface of the STI structure 120 may be formed to be leveled to the top surfaces of the first protruding portion 106A and the second protruding portion 106B.

Figure 2C:
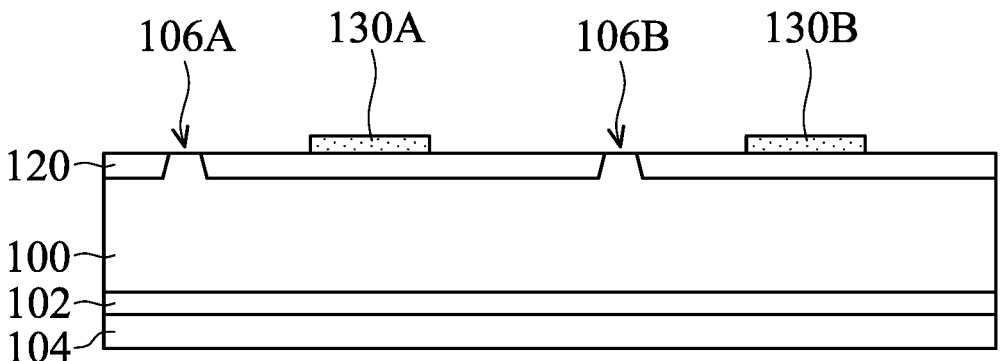

Next, referring to FIG. 2C, a first resistance layer 130A and a second resistance layer 130B are formed on the shallow trench isolation structure 120. The formation of the first resistance layer 130A and the second resistance layer 130B includes depositing materials (such as polysilicon) for the first resistance layer 130A and the second resistance layer 130B on the shallow trench isolation structure 120 and patterning the materials by lithography and etching processes, etc.

Figure 2D:
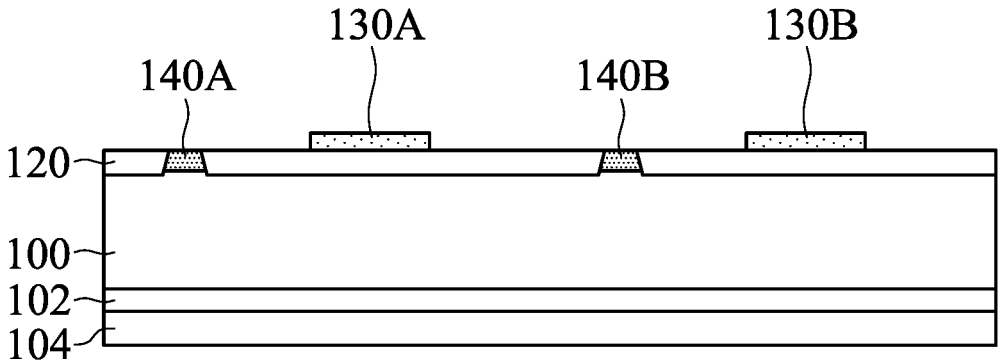

Then referring to FIG. 2D, the first heavily doped region 140A and the second heavily doped region 140B are embedded into the shallow trench isolation structure 120, and the first heavily doped region 140A and the second heavily doped region 140B are in physical contact with the semiconductor layer 100.

In some embodiments, the formation of the first heavily doped region 140A and the second heavily doped region 140B includes implanting dopants into the first protruding portion 106A and the second protruding portion 106B. In some embodiments, the dopants have the same conductivity type as that of the semiconductor layer 100. The first heavily doped region 140A and the second heavily doped region 140B may include the same dopant as that of the semiconductor layer 100, and this dopant has a higher concentration in the first heavily doped region 140A and the second heavily doped region 140B.

In some other embodiments, the formation of the first heavily doped region 140A and the second heavily doped region 140B includes removing portions of the first protrusion 106A and the second protrusion 106B to form a first through hole and a second through hole (not shown) exposing the semiconductor layer 100 in the shallow trench isolation structure 120. Then, a semiconductor material may be filled in the first through hole and the second through hole to form a first heavily doped region 140A and a second heavily doped region 140B. In some embodiments, the semiconductor material includes the same material as the semiconductor layer 100. In some embodiments, the semiconductor material may be further doped with p-type or n-type dopants. For example, the p-type dopant may be boron, aluminum, gallium, $BF_2$, similar materials or combinations thereof, and the n-type dopant may be nitrogen, phosphorus, arsenic, antimony, similar materials or combinations thereof. It should be understood that, although the resistance layer is formed first and then the heavily doped region is formed in the embodiments shown in FIGS. 2A-2F, the present disclosure does not limit the forming sequence of the resistance layer and the heavily doped region. In some other embodiments, the heavily doped region may also be formed first and then the resistance layer is formed.

Figure 2E:
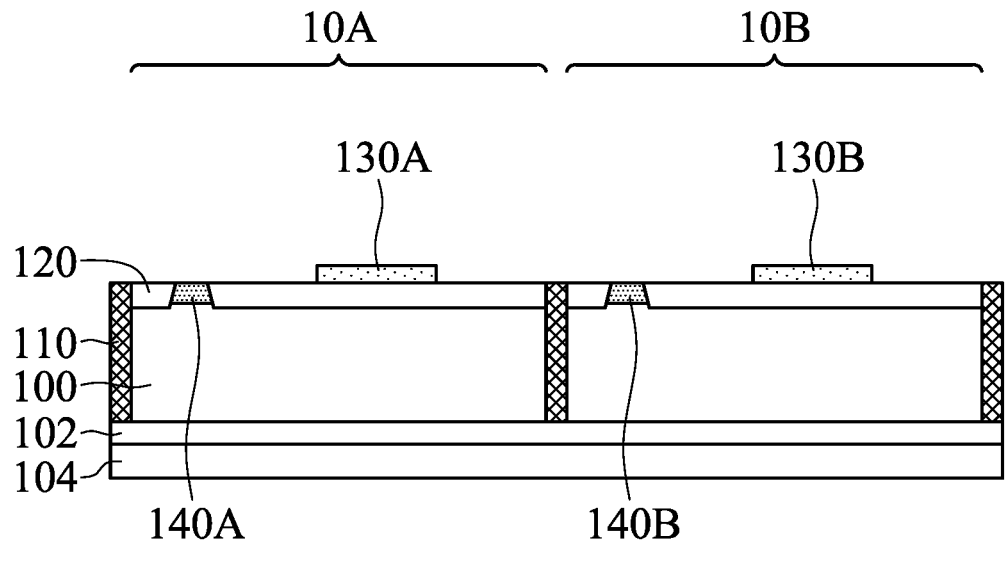

Next, referring to FIG. 2E, a deep trench isolation structure is formed to separate the semiconductor device into a plurality of units, which include a first unit 10A and a second unit 10B. As shown in FIG. 2E, the first resistance layer 130A and the first heavily doped region 140A are located in the first unit 10A, and the second resistance layer 130B and the second heavily doped region 140B are located in the second unit 10B.

In some embodiments, the formation of the deep trench isolation structure 110 may include forming a deep trench (not shown) penetrating the shallow trench isolation structure 120 and the semiconductor layer 100 and filling the deep trench with an insulating material.

In some embodiments, the deep trenches may be formed using a masking layer (not shown additionally) and a suitable etching process. For example, the masking layer may include a hard mask of silicon nitride and be formed by a process such as chemical vapor deposition (CVD). The masking layer may also be formed using other materials, such as oxide, oxynitride, silicon carbide, combinations thereof, etc., and may be formed using other processes, such as plasma enhanced chemical vapor deposition (PECVD), low pressure chemical vapor deposition (LPCVD), or even formation of silicon oxide followed by nitridation. Once formed, the masking layer may be patterned by a suitable lithography process to expose portions of the semiconductor layer 100 that will be removed to form the deep trenches. In some embodiments, the patterned masking layer substantially corresponds to the semiconductor layer 100 directly above the semiconductor layer 100 in FIG. 1.

As those skilled in the art understand, however, the processes and materials for forming the masking layer are not the only method that can be used to protect portions of the semiconductor layer 100 when exposing other portions of the semiconductor layer 100 for forming the deep trench. Any suitable process, such as patterning and developing a photoresist, may be used to expose the portion of the semiconductor layer 100 that will be removed to form the shallow trench. The scope of the present disclosure is intended to encompass all such methods.

Deep trenches are formed in the semiconductor layer 100 after forming the patterned masking layer. The exposed semiconductor layer 100 may be removed by a suitable process such as reactive ion etching (RIE) to form deep trenches in the semiconductor layer 100, although any suitable process may be used. The depth of the deep trenches may depend on the material and thickness of the semiconductor layer 100, as long as the potential between the tanks can be reduced sequentially, the present disclosure does not limit the depth of the deep trenches. In some embodiments, the deep trench is formed such that the bottom surface of the deep trench is leveled with the bottom surface of the semiconductor layer 100. In some other embodiments, the deep trench is formed such that the bottom surface of the deep trench is leveled with the bottom surface of insulating layer 102.

The insulating material used to fill the deep trenches may be, for example, silicon oxide, silicon oxynitride, phosphosilicate glass PSG), borosilicate glass (BSG), borophosphosilicate glass borophosphosilicate glass (BPSG), undoped silicate glass (USG), fluorinated silicate glass (FSG), other suitable materials, or a combination thereof. In addition, the above insulating material may be deposited by high density plasma chemical vapor deposition (HDP-CVD), flowable CVD (FCVD), other suitable deposition processes, or a combination of.

Figure 2F:
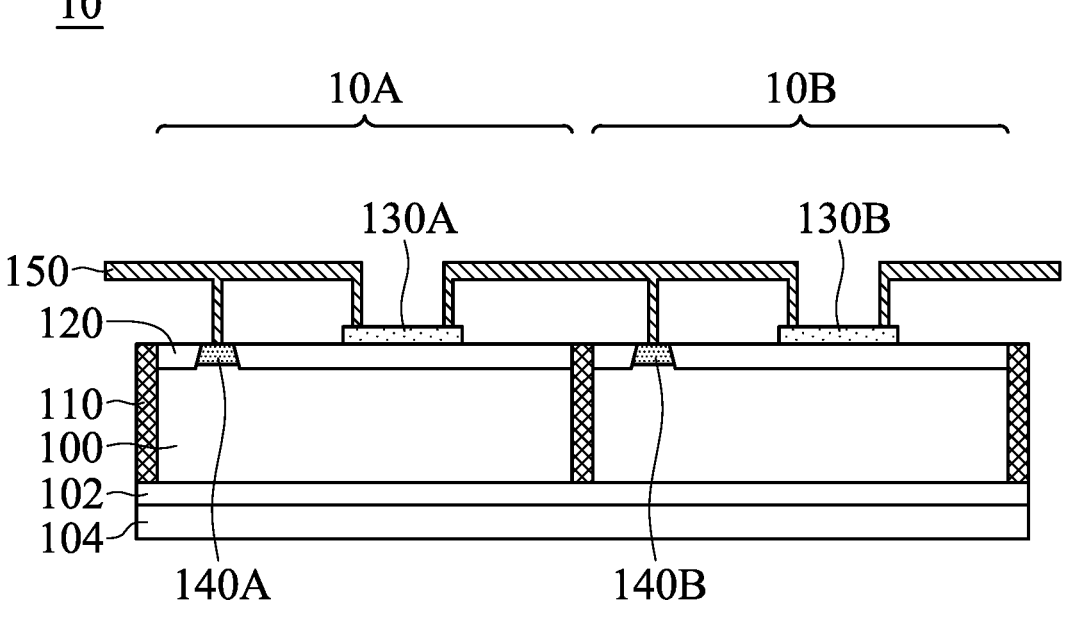

Next, referring to FIG. 2F, the formation of the semiconductor device 10 further includes forming a conductive line 150 electrically connecting the first resistance layer 130A, the second resistance layer 130B, and the second heavily doped region 140B.

Although only the formation of two units in the semiconductor device 10 is shown in FIGS. 2A-2F, the present disclosure is not limited thereto. Depending on the operating voltage of the semiconductor device 10, other numbers of units, which are separated by the deep trench isolation structure 110 and connected in series by a plurality of conductive lines 150, may be formed in the semiconductor device 10, so as to achieve the effect of decreasing the voltage sequentially.

For example, the semiconductor device 10 may further include another conductive line 150 electrically connected to the first resistance layer 130A and the first heavily doped region 140A, and this conductive line 150 may be further electrically connected to a resistance layer in another unit (tank). On the other side, the semiconductor device 10 may further include yet another conductive line 150 electrically connecting the third resistive layer 130B and the resistance layer and a heavily doped region in yet another unit (tank).

In summary, the present disclosure provides a semiconductor device including a deep trench isolation structure and a heavily doped region. The multiple heavily doped regions embedded in the shallow trench isolation structure can prevent current breakdown from occurring between the resistance layer and the semiconductor layer. In this way, by using the deep trench isolation structure to separate the semiconductor layer of each tank, and electrically connecting each unit with a lower limiting voltage with a conductive line, the voltage can be reduced multiple times between each unit (tank). Compared with the conventional structure with a resistive layer for voltage drop, the semiconductor device of the present disclosure can be applied with a higher operating voltage without increasing the thickness of the shallow trench isolation structure on the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor layer;
a deep trench isolation structure separating the semiconductor device into a plurality of units, wherein the plurality of units comprises a first unit and a second unit;
a shallow trench isolation structure disposed on a portion of the semiconductor layer in one of the plurality of units;

a first resistance layer and a second resistance layer disposed on the shallow trench isolation structure in the first unit and the second unit respectively;
a first heavily doped region and a second heavily doped region embedded in the shallow trench isolation structure and in physical contact with the semiconductor layer in the first unit and the second unit respectively; and
a conductive line electrically connecting the first resistance layer, the second resistance layer, and the second heavily doped region,
wherein the semiconductor device further comprises an insulating layer covering a bottom surface of the semiconductor layer, and the deep trench isolation structure extends from a top surface of the shallow trench isolation structure to a top surface of the insulating layer.

2. The semiconductor device as claimed in claim 1, wherein the deep trench isolation structure penetrates through the shallow trench isolation structure between each of the units.

3. The semiconductor device as claimed in claim 1, wherein the deep trench isolation structure laterally surrounds portions of the semiconductor layer in each of the units, and the semiconductor layer is electrically isolated between each of the units.

4. The semiconductor device as claimed in claim 1, wherein the shallow trench isolation structure is discontinuous between each of the units.

5. The semiconductor device as claimed in claim 1, further comprising another conductive line electrically connecting the first resistance layer and the first heavily doped region.

6. The semiconductor device as claimed in claim 1, wherein the first resistance layer and the second resistance layer are horizontally spaced apart from edges of the first unit and the second unit respectively.

7. The semiconductor device as claimed in claim 1, wherein the first heavily doped region, the second heavily doped region, and the semiconductor layer have the same conductivity type.

8. The semiconductor device as claimed in claim 1, wherein thicknesses of the first heavily doped region and the second heavily doped region are smaller than a thickness of the shallow trench isolation structure.

9. The semiconductor device as claimed in claim 1, wherein the shallow trench isolation structure and the deep trench isolation structure comprise different materials.

10. The semiconductor device as claimed in claim 1, wherein the plurality of units further comprises a third unit, and the third unit comprises:
a third resistance layer disposed on the shallow trench isolation structure; and
a third heavily doped region embedded in the shallow trench isolation structure and in physical contact with the semiconductor layer;
wherein the semiconductor device further comprises another conductive line electrically connecting the second resistance layer, the third resistance layer, and the third heavily doped region.

11. A method for forming the semiconductor device as claimed in claim 1, comprising:
forming a shallow trench isolation structure on a semiconductor layer;
forming a first resistance layer and a second resistance layer on the shallow trench isolation structure;

embedding a first heavily doped region and a second heavily doped region into the shallow trench isolation structure, wherein the first heavily doped region and the second heavily doped region are in physical contact with the semiconductor layer;

forming a deep trench isolation structure separating the semiconductor device into a plurality of units comprising a first unit and a second unit, wherein the first resistance layer and the first heavily doped region are in the first unit, and the second resistance layer and the second heavily doped region are in the second unit; and forming a conductive line electrically connecting the first resistance layer, the second resistance layer, and the second heavily doped region.

12. The method for forming the semiconductor device as claimed in claim 11, wherein before embedding the first heavily doped region and the second heavily doped region into the shallow trench isolation structure, the semiconductor layer has a first protruding portion and a second protruding portion in the shallow trench isolation structure.

13. The method for forming the semiconductor device as claimed in claim 12, wherein forming the first heavily doped region and the second heavily doped region comprises implanting a dopant into the first protruding portion and the second protruding portion.

14. The method for forming the semiconductor device as claimed in claim 13, wherein the dopant has the same conductivity type as the semiconductor layer.

15. The method for forming the semiconductor device as claimed in claim 11, wherein forming the first heavily doped region and the second heavily doped region comprises:

forming a first through hole and a second through hole exposing the semiconductor layer in the shallow trench isolation structure; and filling the first through hole and the second through hole with a semiconductor material.

16. The method for forming the semiconductor device as claimed in claim 11, wherein forming the deep trench isolation structure comprises:

forming a deep trench penetrating through the shallow trench isolation structure and the semiconductor layer; and filling the deep trench with an insulating material.

17. The method for forming the semiconductor device as claimed in claim 11, further comprising forming another conductive line electrically connecting the first resistance layer and the first heavily doped region.

* * * * *